United States Patent
Suh (10) Patent No.: US 7,399,536 B2
(45) Date of Patent: Jul. 15, 2008

(54) ORGANIC ELECTROLUMINESCENT DEVICE DRIVEN AT LOW VOLTAGE

(75) Inventor: Min-Chul Suh, Gyeonggi-do (KR)

(73) Assignee: Samsung SDI Co., Ltd., Suwon-si (KR)

( * ) Notice: Subject to any disclaimer, the term of this patent is extended or adjusted under 35 U.S.C. 154(b) by 547 days.

(21) Appl. No.: 10/757,471

(22) Filed: Jan. 15, 2004

(65) Prior Publication Data

US 2004/0150330 A1     Aug. 5, 2004

(30) Foreign Application Priority Data

Feb. 3, 2003    (KR) .................... 10-2003-0006617

(51) Int. Cl.
  *H01L 51/50*     (2006.01)
(52) U.S. Cl. .................. 428/690; 428/917; 313/504; 313/506
(58) Field of Classification Search ............ 428/690, 428/917; 313/504, 506; 427/66
  See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 4,720,432 A | 1/1988 | VanSlyke et al. | |
| 4,769,292 A | 9/1988 | Tang et al. | |
| 5,093,698 A | 3/1992 | Egusa | |
| 5,247,190 A | 9/1993 | Friend et al. | |
| 5,601,903 A | 2/1997 | Fujii et al. | |
| 5,807,627 A | 9/1998 | Friend et al. | |
| 6,423,429 B2 | 7/2002 | Kido et al. | |
| 6,566,807 B1 | 5/2003 | Fujita et al. | |
| 6,589,673 B1 | 7/2003 | Kido et al. | |
| 2002/0038867 A1* | 4/2002 | Kobori et al. | ............. 257/40 |
| 2004/0146744 A1* | 7/2004 | Seo et al. | ............. 428/690 |

FOREIGN PATENT DOCUMENTS

| | | |
|---|---|---|
| CN | 1236289 | 11/1999 |
| CN | 1290119 | 4/2001 |
| EP | 1017118 A2 * | 7/2000 |
| JP | 2000-150169 * | 5/2000 |
| KR | 1998-26046 | 6/1998 |
| KR | 2002-64839 | 11/2000 |
| WO | WO 01/67825 | 9/2001 |

OTHER PUBLICATIONS

J. Blochwitz et al., "Low voltage organic light emitting diodes featuring doped phthalocyanine as hole transport material," *Applied Physics Letters*, vol. 73, No. 6, Aug. 10, 1998, pp. 729-731.

(Continued)

*Primary Examiner*—Dawn Garrett
(74) *Attorney, Agent, or Firm*—Stein, McEwen & Bui, LLP (57) ABSTRACT

An organic electroluminescent device has an improved lifetime and may be driven at a low voltage. The organic electroluminescent device includes; a substrate; a first electrode to define a pixel region on the substrate; multiple organic film layers to perform light emission on the first electrode; and a second electrode laminated on the multiple organic film layers; wherein the multiple organic film layers include at least an emitting layer, and at least one of a hole injection layer and a hole transport layer. The at least one of the hole injection layer and the hole transport layer includes an electron acceptor material.

24 Claims, 4 Drawing Sheets

OTHER PUBLICATIONS

Jingsong Huang et al., "Low-voltage organic electroluminescent devices using *pin* structures," *Applied Physics Letters*, vol. 80, No.1, Jan. 7, 2002, pp. 139-141.

Chinese Office Action issued on Sep. 28, 2007, in Chinese Patent Application No. 2004100387542 (in Chinese with English translation).

* cited by examiner

ORGANIC ELECTROLUMINESCENT DEVICE DRIVEN AT LOW VOLTAGE

CROSS-REFERENCE TO RELATED APPLICATIONS

This application claims the benefit of Korean Patent Application No. 2003-6617, filed on Feb. 3, 2003, the disclosure of which is hereby incorporated herein by reference in its entirety.

BACKGROUND OF THE INVENTION

1. Field of the Invention

The present invention relates to an organic electroluminescent device, more particularly, to an organic electroluminescent device capable of being driven at low voltage.

2. Description of the Related Art

An organic electroluminescent device (OELD) has advantages in that it is thin and lightweight. The components and processing are simple, high definition and a wide view angle are secured, a complete moving picture and high color purity are realized, and electrical characteristics appropriate a for mobile purpose are obtained by low power consumption and low voltage driving of a self-emitting type display using a phenomenon that light is generated as electrons are being connected to holes in an organic compound layer when current flows to a fluorescent or a phosphorescent organic compound thin film.

The organic electroluminescent device is divided into a passive driving device and an active driving device according to a driving method, a small molecular weight device and a polymeric device according to the material and the structure.

In the case of a small molecular weight device, the efficiency and lifetime are improved by forming a hole transport layer between the emitting layer and the anode and forming an electron transport layer between the emitting layer and the cathode, with the emitting layer being substantially between the anode and the cathode as mentioned in U.S. Pat. Nos. 4,356,429, 4,539,507, 4,720,432 and 4,769,292. These patents substantially include color patterning by deposition and technologies commonly applied to passive and active types of display devices.

On the other hand, an initial polymeric device, different from the small molecular weight device, is formed in a sandwich shaped structure, wherein a light emitting polymer is introduced between a transparent anode and a metal cathode as mentioned in U.S. Pat. No. 5,247,190. The polymeric device has disadvantages in that the efficiency and the lifetime are unfavorable since the consistency between the work function of both electrodes and the highest occupied molecular orbital (HOMO) and the lowest unoccupied molecular orbital (LUMO) values of polymers are not well matched. On the contrary, the efficiency and the lifetime are quite improved by introducing a metal for the cathode having a work function value similar to the LUMO value of the polymer at the cathode side. It is difficult to introduce material except ITO and IZO since there is a limitation of a transparent electrode at the anode side.

A structure to adopt a single layer comprising a light emitting polymer between the anode and the cathode is typical due to the advantages that the functions of the electron transport and the hole transport of a general light emitting polymer are simultaneously performed when fabricating a full color PLED device. However, a four-layer structure adopting a first charge carrier injection layer, two layers of a semiconductor conjugated polymer and a second charge carrier injection layer is adopted in U.S. Pat. No. 5,807,627, wherein the efficiency of the device is increased by adding charge carrier injection layers even though implementation of the improved electron transport and the hole transport is difficult. However, there is a limitation wherein polymers having different characteristics should be adopted in a single device so that a lower layer is not dissolved during wet processing, and only mono color is realized because an emitting layer may not be patterned since the total process proceeds by spin coating in the case of adopting PPV series polymer adopting a multilayer structure, thus constructing two layers.

Eventually, the necessity to increase the efficiency or the device stability gain force even in a polymeric light emitting device by eliminating a simple structure has been recognized, and the high molecular weight device also requires addition of a subsidiary layer to aid injection or movement of the charge carriers as in the lower molecular weight device.

Each layer may be introduced by vacuum deposition in the case of a small molecular weight organic electroluminescent device. However, introduction of various organic layers is restricted since the spin coating process is used in the case of the polymeric organic electroluminescent device. Therefore, the polymeric organic electroluminescent device is generally constructed in a simple structure having anode and cathode electrodes, a hole injection layer and an emitting layer.

However, the polymeric organic electroluminescent device not only has problems due to diffusion of the anode material indium or tin into the emitting layer, or because of a change in the emitting layer due to use of a hole injection layer having acidic characteristics, since the device is fabricated without a separate hole transport layer or an electron transport layer in the upper and the lower parts of the emitting layer due to its single layer structure. This also causes a negative effect in that the stability of the device is lessened considerably due to diffusion of the cathode metal into the emitting layer that may occur when depositing the cathode material.

One of the methods to solve the above-cited problems is a method to prevent diffusion by forming a thick hole-blocking layer (or an electron transport layer) or a hole transport layer in the upper and the lower parts of the emitting layer. However, the hole transport layer, the hole-blocking layer and the electron transport layer contain a large amount of self-emitting materials and change the wavelength of the light coming out of the emitting layer by forming an exciplex on the interface with the emitting layer, even through the materials do not emit light by themselves. Furthermore, there is a problem that forming thick materials in the upper and the lower parts of the emitting layers considerably increases the driving voltage.

On the other hand, a combined concept of reduction of the driving voltage and the luminance quenching principle by promoting a non-radioactive process different from emission does not exist, although existing patents on doping mainly concern the concept of energy transfer using a method for mixing the emitting dopant with the emitting host substances (U.S. Pat. No. 4,769,292) or a concept of preventing trapping of the electrons by simply mixing materials having low LUMO value with a hole transport layer or an emitting layer (U.S. Pat. No. 5,601,903). This concept is also adopted to the small molecular weight (or hybrid type) organic electroluminescent device as well as the polymer light emitting device.

SUMMARY OF THE INVENTION

Therefore, to solve the foregoing and/or other problems of the related art, it is an aspect of the present invention to provide an organic electroluminescent device having a luminance quenching effect and being driven at a low voltage by lowering the driving voltage and improving the power consumption.

To achieve the foregoing and/or other aspects, the present invention provides an organic electroluminescent device comprising a substrate; a first electrode to define a pixel region on the substrate; multiple organic film layers for light emission on the first electrode; and a second electrode formed on the multiple organic film layers, wherein the multiple organic film layers comprise at least an emitting layer, a hole injection layer and/or a hole transport layer, and the hole injection layer and/or the hole transport layer comprise or comprises an electron acceptor material.

Furthermore, the present invention provides an organic electroluminescent device comprising a substrate; a first electrode to define a pixel region on the substrate; multiple organic film layers for light emission on the first electrode; and a second electrode formed on the multiple organic film layers, wherein the multiple organic film layers comprise at least an emitting layer, a hole-blocking layer, an electron injection layer and/or an electron transport layer, and the hole-blocking layer, the electron injection layer and/or the electron transport layer comprise an electron donor material.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present invention, examples of which are illustrated in the accompanying drawings, wherein like reference numerals refer to the like elements throughout. The embodiments are described below to explain the present invention by referring to the figures.

In the present invention, a series of materials are introduced to obtain a luminance quenching effect by adding an electron acceptor material and an electron donor material that readily ionize electrons in an electric field without the hindrance of transporting electrons to the hole injection layer (or the hole transport layer) and the hole-blocking layer (or the electron transport layer) respectively, thus suppressing the emission process that may occur inside the hole transport layer and the hole-blocking layer (or the electron transport layer) and show an effect of suppressing or reducing the increase of the driving voltage by causing a dissociation of the charges under the existence of the electric field since the materials are easily polarized under the electric field at the same time.

Figure 1A:
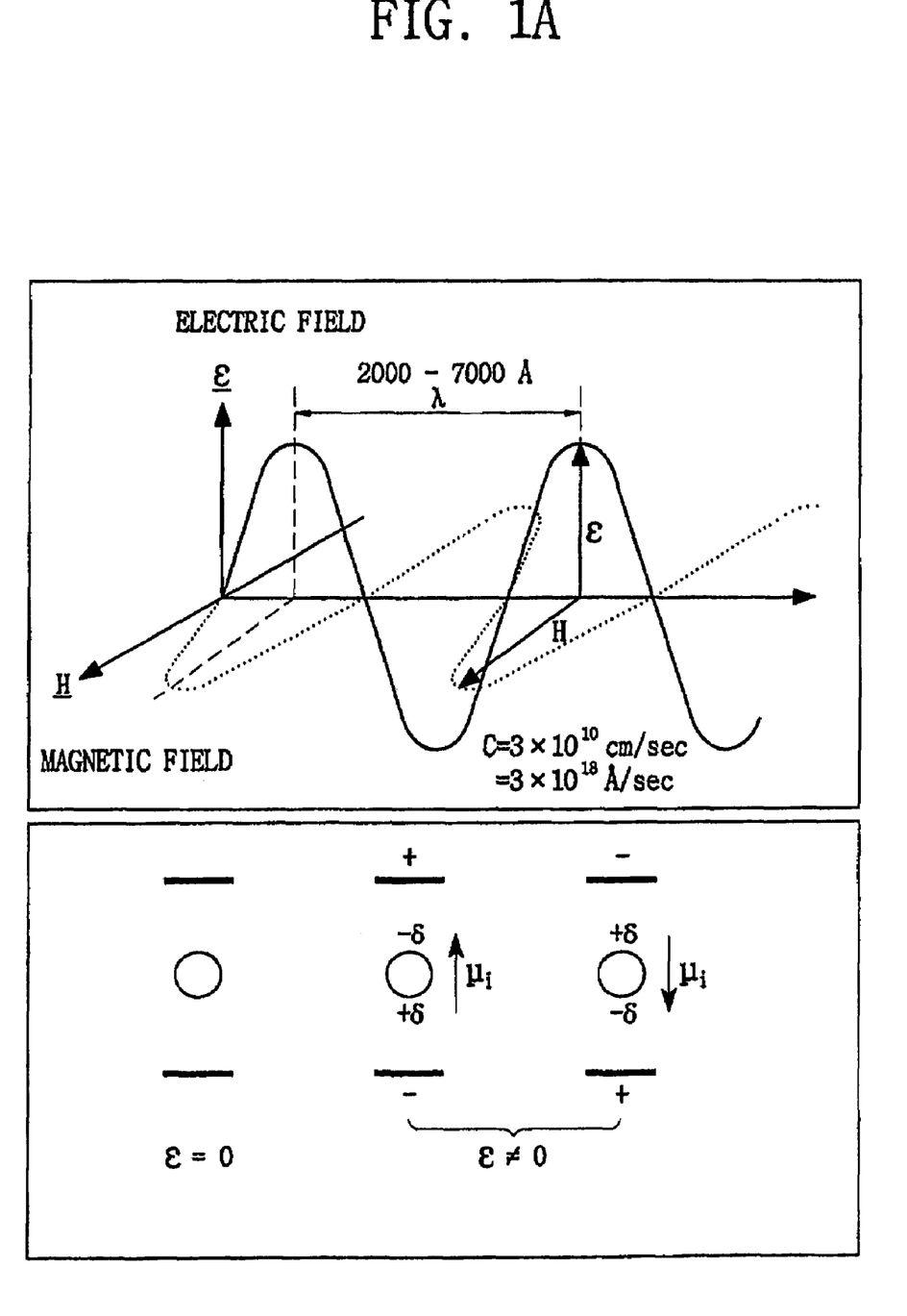
FIG. 1A is a drawing showing that dipole moment of molecules is changed by an electric field.
Figure 1B:
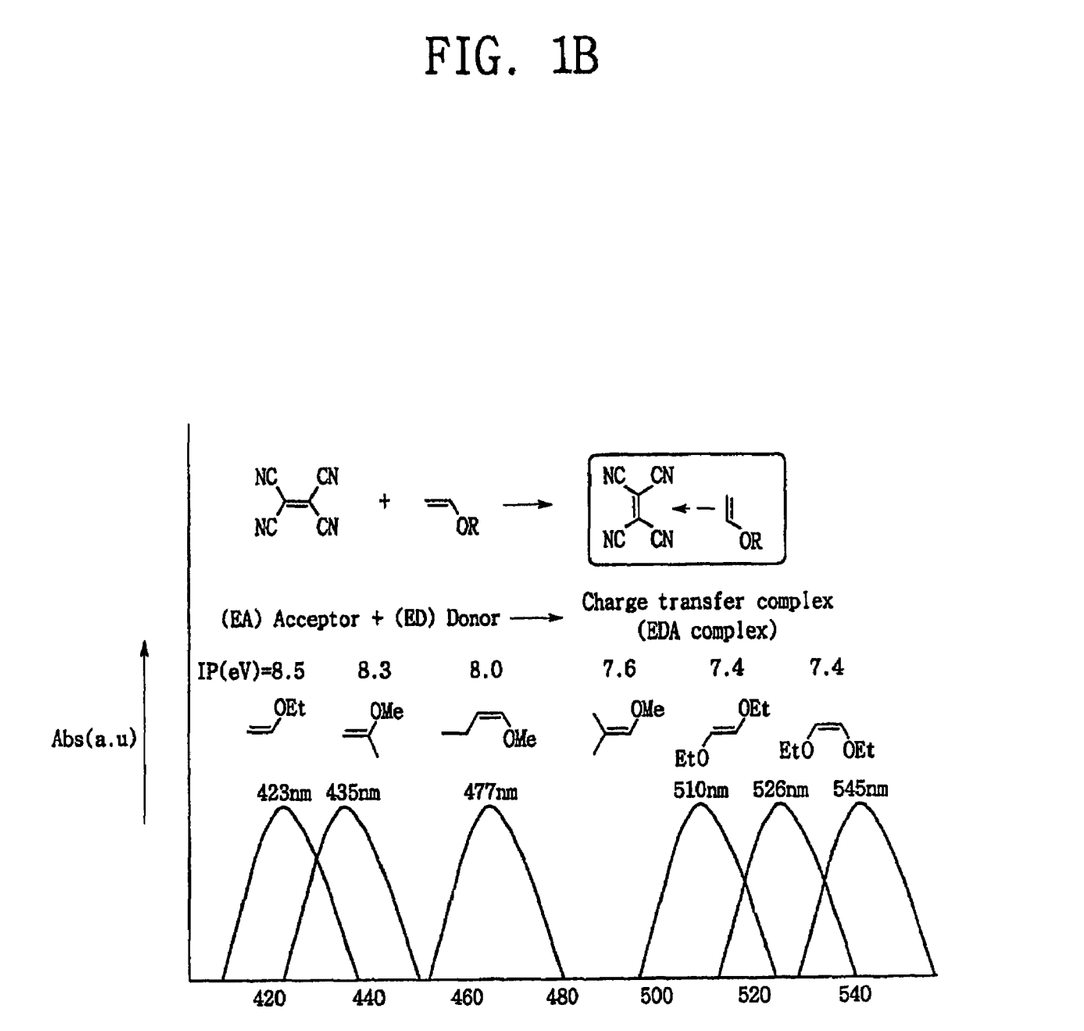
FIG. 1B is a drawing showing charge transfer complex formation phenomena in which giving and receiving of electrons occur between electron donor and electron acceptor.

FIG. 1A is a drawing showing that the dipole moment of the molecules is changed by an electric field, and FIG. 1B is a drawing showing charge transfer complex formation phenomena in which giving and receiving of the electrons occur between the electron donor and the electron acceptor.

The dipole moment of molecules is maximized in the case wherein an electric field is utilized, as shown in FIG. 1A, while charge transfer complex formation phenomena in which giving and receiving of electrons between the electron donor and the electron acceptor occur during generation of the dipole moment, as shown in FIG. 1B.

The lifetime of an organic electroluminescent device according to the present invention is increased by 100% by causing an electron accumulation prevention effect in the emitting layer using the charge transfer complex formation principle, particularly in the case of mixing the electron acceptor with the hole injection layer and/or the hole transport layer (mainly formed in an electron donor shape).

A structure of the present invention is a structure of the upper part of the anode of an organic electroluminescent device, and the lower part of the anode is applied to a device, each pixel region of which is divided by an insulation layer, and in which a high molecular weight emitting layer is used, regardless of whether the active driving device includes a TFT.

Figure 3:
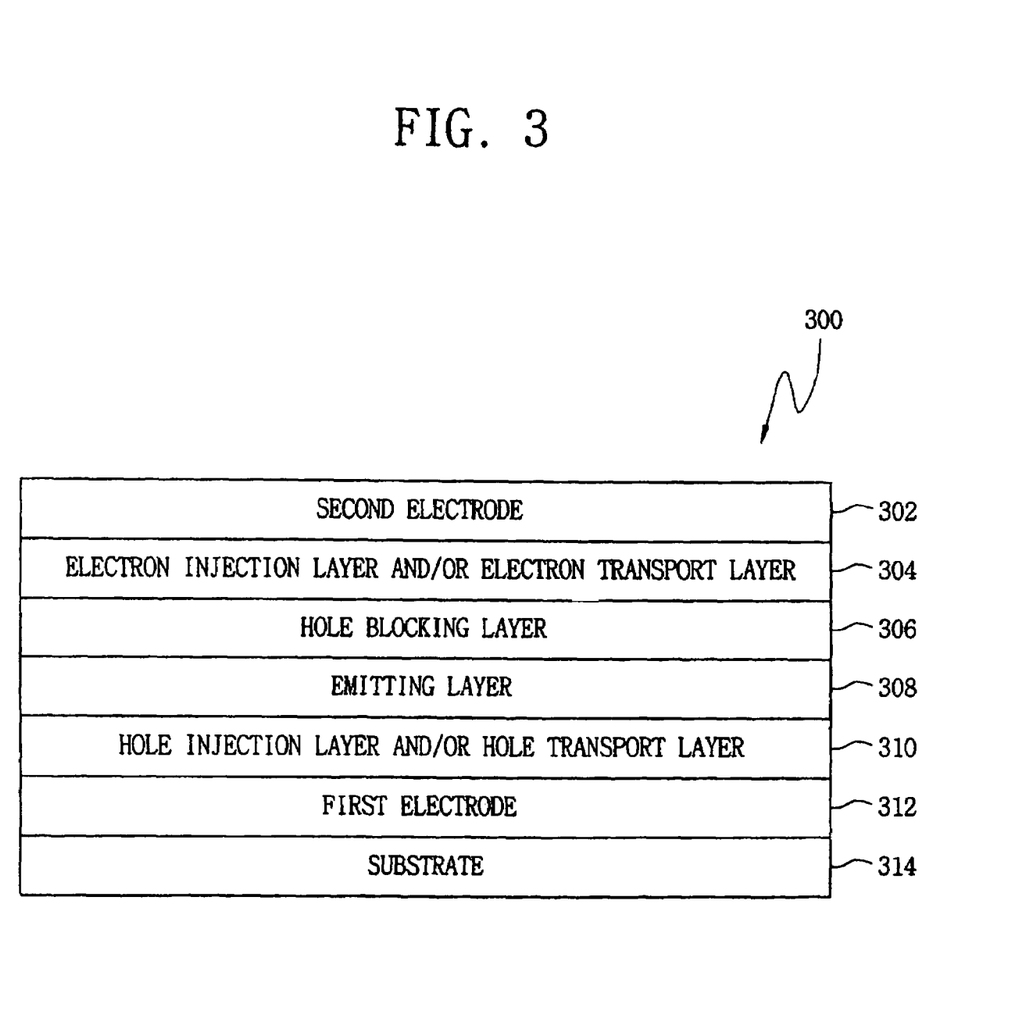
FIG. 3 is a block diagram of an embodiment of an organic electroluminescent device in accordance with the present invention.

In an organic electroluminescent device according to an embodiment of the present invention, as shown in FIG. 3, numeral 300 (not to scale), a first electrode 312 to define a pixel region is first formed on a semiconductor substrate 314 such as polysilicon, and then multiple organic film layers comprising at least an emitting layer 308, a hole injection layer and/or a hole transport layer 310 are formed on the first electrode 312. The multiple organic film layers are layers that may be used as a common layer, regardless of patterning of the emitting layer, wherein the hole injection layer and/or the hole transport layer 310 include(s) an electron acceptor material. Therefore, an organic electroluminescent device of the present invention not only obtains a luminance quenching effect and device stability, but also suppresses or reduces an increase of the driving voltage of the device.

The electron acceptor material is one of an aromatic, an olefin, a perylene and a heterocyclic compound containing a nitro group or a cyano group, or one or more electron donor materials selected from the group consisting of 2,4,7-trinitrofluorenone, 2,4-dinitroaniline, 5-nitroanthranilonitrile, 2,4-dinitrodiphenylamine, 1,5-dinitronaphthalene and 3,5-dinitrobenzonitrile.

0.01 to 10 wt. % of the electron acceptor material is generally used for the total weight of the hole injection layer and/or the hole transport layer.

The hole injection layer and/or the hole transport layer may be formed in a thin film by, for example, co-deposition or spin-coating.

First, one or more layers are formed by co-depositing the electron acceptor material while depositing the hole injection layer or the hole transport layer, although the rest of the layers are formed in the same manner as in an ordinary low molecule deposition process wherein the emitting layer is formed by a deposition process.

Furthermore, co-depositing an electron donor material while forming one or more layers of HBL 306, ETL 304 and HBL 306+ETL 304 after forming an emitting layer 308 may be utilized to form one or more layers. In this case, it is also possible to dope any one part of the lower layer part or the upper layer part of the emitting layer. A second electrode 302 may be placed thereon.

When forming an emitting layer through laser induced thermal imaging (LITI), the emitting layer is formed by spin-coating a solution prepared by injecting holes into an anode layer or mixing an electron acceptor material with a material having hole transport capability, and the layer of the emitting polymer is transferred to the emitting layer using a laser after forming a layer of the emitting polymer (LEP) on a separately prepared donor film.

One or more layers may be formed by moving a substrate on which the layer of the emitting polymer is formed to a deposition chamber and co-depositing the layer of the emitting polymer and the electron donor material while forming one or more layers of the HBL, ETL, HBL+ETL when further forming the former layers of HBL, ETL, HBL+ETL. Any one part in the lower layer part or the upper layer part of the emitting layer may also be doped.

Furthermore, a deposition thickness of the hole injection layer and/or the hole transport layer is generally 1 to 4,000 Å, and an ordinarily used emitting material, regardless of whether it is a high molecular weight material or a low molecular weight material, may be used as the emitting layer.

An organic electroluminescent device is fabricated by forming a second electrode after forming multiple organic film layers, and then sealing the second electrode.

On the other hand, in another embodiment of the present invention, the multiple organic film layers comprise at least an emitting layer, a hole-blocking layer and/or an electron transport layer, and the hole-blocking layer and/or the electron transport layer comprises an electron donor material. An emitting layer is first formed on the first electrode to define a pixel region in this embodiment. The hole-blocking layer and/or the electron transport layer are formed on the emitting layer which is on the substrate.

An electron donor material is included in the hole-blocking layer and/or the electron transport layer.

The electron donor material is one of an aromatic, an olefin, an allene, a thiophene and a fulvalene heterocyclic compound containing hydrogen, an alkyl group, a phenyl group, an $NR_2$ group, an OR group and an $SiR_3$ group, or one or more electron donor materials selected from the group consisting of poly(3,4-ethylene-dioxythiophene), tetraphenylethylene, azulene, 1,2,3,4-tetraphenyl-1,3-cyclophentadiene, and bis(ethylenedithio)tetrathiafulvalene.

On the other hand, the hole-blocking layer and/or the electron transport layer are formed in a thickness of 1 to 4,000 Å and may form a thin film by, for example, co-deposition or spin coating.

First, when the emitting layer is deposited by a deposition process, the rest of the layers are formed in the same manner as in an ordinary low molecule deposition process, and one or more layers are formed by co-depositing the electron donor material while forming one or more layers of HBL, ETL, HBL+ETL after forming the emitting layer. In this case, it is also possible to dope any one part of the lower layer part or the upper layer part of the emitting layer.

When forming an emitting layer by laser induced thermal imaging (LITI), an organic layer is formed by spin coating a solution prepared by injecting holes into an anode layer or mixing an electron acceptor material with a material having a hole transport capability, and the layer of the emitting polymer is transferred to the organic layer using a laser after forming a layer of the emitting polymer (LEP) on a separately prepared donor film.

One or more layers may be formed by moving a substrate on which the layer of the emitting polymer is formed to a deposition chamber and co-depositing the layer of the emitting polymer and the electron donor material while forming one or more layers of the HBL, ETL, HBL+ETL. In addition, any one part in the lower layer part or upper layer part of the emitting layer may be doped.

A small molecular weight device or polymer device formed by the foregoing processes shows a lower driving voltage and improved results of color coordination or stability compared to a non-doped device.

Contrary to the structure of an ordinary polymeric electroluminescent (EL) device, an organic EL device of the present invention comprises a layer to aid hole transport alone, or together with a dopant that is an electron acceptor, directly under patterned R, G and B emitting layers, and a layer for blocking the hole transport (HBL) alone, or together with a dopant that is an electron donor directly above the emitting layers.

Furthermore, the organic EL device of the present invention may further comprise a compound layer to improve electron transportation alone, or together with an electron donor in the upper side of the HBL.

On the other hand, a device fabricating process according to the present invention is described as follows.

When forming a high molecular weight organic electroluminescent device, an ITO substrate is prepared by $UV/O_3$ treating the cleaned substrate after cleaning a substrate in isopropyl alcohol (IPA) and acetone. In the case of the high molecular weight organic EL device, after PEDOT or PANI is coated on the whole substrate, PEDOT or PANI is wiped on a cathode contact part, which is used as a hole injection layer on the ITO substrate to a thickness of hundreds of Å and heat-treating the PEDOT or PANI coated ITO substrate at a temperature of 200° C. for 5 minutes. After a solution is coated on the whole substrate, the solution is once more wiped on the cathode contact part, which is prepared by blending the HTL material with an electron acceptor material on an HIL to a thickness of hundreds of Å and heat-treating the blended solution coated HIL at a temperature of 200° C. for 5 minutes. R, G and B materials are patterned on the HTL using laser induced thermal imaging (LITI).

A HBL/ETL/cathode, a HBL/cathode or a ETL/cathode are sequentially deposited as a common layer on the emitting layer after completing patterning, wherein an electron donor material may be co-deposited with the HBL or the ETL between any one of the layers when depositing the HBL or the ETL.

When forming a small molecular weight organic electroluminescent device, after loading a substrate that has been cleaned in the same cleaning manner as in the high molecular weight organic electroluminescent device into the deposition chamber, a hole injection layer is deposited on the ITO substrate to a thickness of hundreds of Å, wherein an electron acceptor material may be co-deposited on the ITO substrate with the hole injection layer. An HTL alone is deposited or the HTL, together with the electron acceptor material, is co-deposited on the hole injection layer. The ETL/cathode electrode is sequentially deposited on the R, G and B materials after depositing R, G and B materials on the HTL, wherein an electron donor material together with the HBL or ETL is co-deposited on any one or more layers when depositing HBL or ETL. The low molecular weight organic EL device is fabricated by the same process before emitting layer deposition as in the high molecular weight organic EL device, according to circumstances.

A device in which formation of the cathode electrode is completed is sealed to fabricate a stable organic EL device.

When comparing characteristics of devices, the power efficiency of the device is increased as much as 30% by doping of HTL, and the lifetime of the device is increased about twice from 160 hours to about 320 hours in the case of a red low molecular weight (phosphorescent material) organic EL device.

Now, the present invention will be described in further detail with reference to Examples. However, it should be understood that the present invention is by no means restricted to such specific Examples.

EXAMPLES 1 TO 10

Examples 1 to 10 show results of a driving voltage, a power efficiency and a life cycle obtained by performing p-doping on an HTL material, wherein an emitting layer used is a low molecular weight red material.

A hole injection layer (HIL formed of PEDOT/PSS manufactured by BAYER CORPORATION) was coated on the $UV/O_3$ treated ITO substrate to a thickness of 0, 60, 80 and 120 nm under appropriate spin coating speed conditions after cleaning an ITO substrate prepared by patterning ITO on a substrate and $UV/O_3$ treating the cleaned ITO substrate for 15 minutes. HTL on a cathode contact part of the hole injection layer coated substrate was peeled off, and test cells on which HIL was coated were moved into a glove box so that the test cells were dried at a temperature of 200° C. for 5 minutes.

HTL (BFE manufactured by DOW CHEMICAL CORPORATION) was spin coated on the cooled HIL coated test cells to a thickness of 20, 80, 140 and 200 nm at a predetermined spin coating speed after sufficiently cooling the dried HIL coated test cells so that the HIL spin coated test cells were dried again at a temperature of 200° C. for 5 minutes, wherein 2,4-dinitroaniline was mixed with the HTL in a concentration of 1, 3 and 5 wt %. A red low molecular weight molecule (Red Dopant in CBP manufactured by UDC CORPORATION) was used as an emitting layer, and the red low molecular weight molecule (Red Dopant in CBP manufactured by UDC CORPORATION) was coated to a thickness of 22 nm using deposition equipment. Balq (5 nm), ALQ3(20 nm), LiF (8 nm) and Al (250 nm) were sequentially deposited on the emitting layer, and the Balq (5 nm), ALQ3 (20 nm), LiF (8 nm) 406 and Al (250 nm) were sealed using moisture absorbing material and a glass cover.

Figure 2:
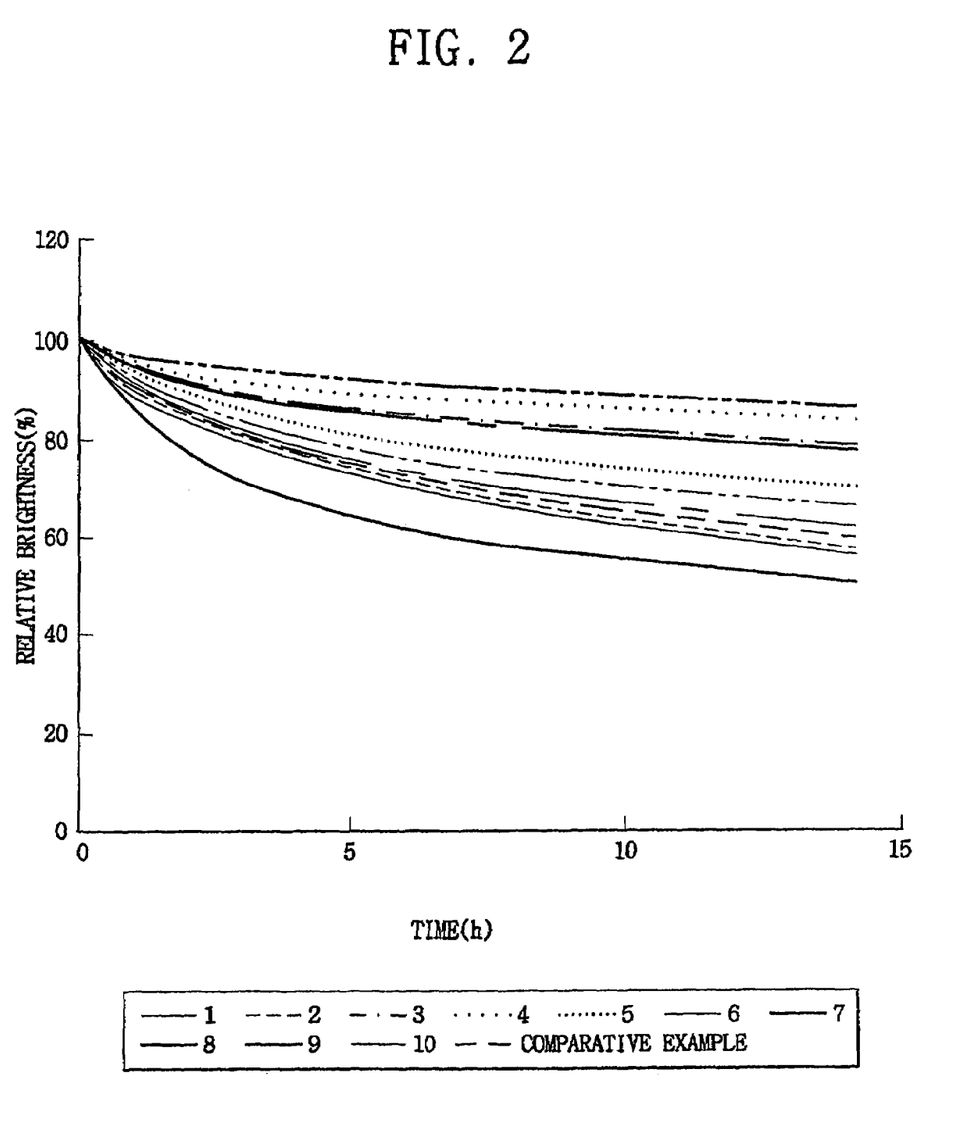
FIG. 2 is a graph showing driving lifetime of an organic electroluminescent device according to preferred embodiment of the present invention.

As shown in Example 8 of Table 1, it may be seen that an expected half life cycle of the device is increased nearly twice, as shown in FIG. 2, although a device having about 80 nm thick HTL (5% p-doping) without PEDOT that is a complete ionic material has a lower driving voltage and a slightly lower power efficiency compared to a device having a non-doped HIL containing structure shown in the Comparative Example.

In an organic electroluminescent device of the present invention, deterioration of the characteristics of the EL device is prevented by thickly forming a hole injection layer (or a hole transport layer) and a hole-blocking layer (or an electron transport layer), thus improving process capability and suppressing a voltage increase. A material having opposite characteristics is doped on the hole transport layer and the hole-blocking layer (or the electron transport layer) so that accumulation of holes and electrons is prevented, to improve stability accordingly. A structure for adopting only advantages of a structure of high molecular weight EL material and multiple layers and complementing disadvantages thereof is adopted. Power efficiency is increased to 30% compared to an organic EL device in which doping is not performed if an electron acceptor on an organic soluble hole transport layer is doped, and which has the same structure as the EL device of the present invention, and the life cycle is increased up to twice an original life cycle, compared to the organic EL device in which doping is not performed if the electron acceptor on the organic soluble hole transport layer is doped, and which has the same structure as the EL device of the present invention.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic electroluminescent device comprising:
    a substrate;
    a first electrode to define a pixel region formed on the substrate;
    multiple organic film layers to perform light emission formed on the first electrode; and
    a second electrode formed on the multiple organic film layers;
    wherein the multiple organic film layers comprise;
        an emitting layer;
        a hole injection layer comprising an electron acceptor material; and
        a hole transport layer comprising the electron acceptor material.

TABLE 1

Device structure: ITO/HIL(x nm)/HTL(y nm)/Red Dopant:
CBP(8%, 22 nm)/Balq(5 nm)/Alq(20 nm)/LiF(8 nm)/Al(250 nm)

|  | HIL thickness (Å) | HTL thickness (Å) | Doping ratio (%) | HIL + HTL (Å) | V at 300 nits | Power efficiency at 300 nits (Lm/W) | Red luminance after 15 hours (%) |
|---|---|---|---|---|---|---|---|
| EXAMPLE 1 | 1200 | 2000 | 1 | 2200 | 10.1 | 1.76 | 57 |
| EXAMPLE 2 | 1200 | 800 | 5 | 2000 | 6 | 2.43 | 58 |
| EXAMPLE 3 | 0 | 2000 | 1 | 2000 | 8.4 | 1.62 | 80 |
| EXAMPLE 4 | 0 | 800 | 1 | 800 | 5.9 | 2.7 | 84 |
| EXAMPLE 5 | 600 | 1400 | 3 | 2000 | 6.7 | 2.3 | 71 |
| EXAMPLE 6 | 600 | 1400 | 3 | 2000 | 6.6 | 2.43 | 71 |
| EXAMPLE 7 | 1200 | 2000 | 5 | 2200 | 7.7 | 2.25 | 52 |
| EXAMPLE 8 | 0 | 800 | 5 | 800 | 5.6 | 2.8 | 87 |
| EXAMPLE 9 | 0 | 2000 | 5 | 2000 | 7.8 | 1.78 | 78 |
| EXAMPLE 10 | 1200 | 800 | 1 | 2000 | 5.9 | 2.37 | 64 |
| COMPARATIVE EXAMPLE | 600 | 200 | 0 | 800 | 6.04 | 3.39 | 64 |

2. The organic electroluminescent device according to claim 1, wherein the electron acceptor material is selected from the group consisting of:
   an aromatic compound having a nitro group or a cyano group;
   an olefin compound having a nitro group or a cyano group;
   a perylene compound having a nitro group or a cyano group;
   a heterocyclic compound having a nitro group or a cyano group;
   2,4,7-trinitrofluorenone;
   2,4-dinitroaniline;
   5-nitroanthranilonitrile
   2,4-dinitrodiphenylamine
   1,5-dinitronaphthalene; and
   3,5-dinitrobenzonitrile.

3. The organic electroluminescent device according to claim 1, wherein the electron acceptor material constitutes 0.01 to 10 wt. % of a total weight of the hole injection layer and of the hole transport layer.

4. The organic electroluminescent device according to claim 1, wherein the multiple organic film layers further comprise at least one layer selected from a hole-blocking layer, an electron injection layer, and an electron transport layer.

5. The organic electroluminescent device according to claim 1, wherein a thickness of the hole injection layer and of the hole transport layer is 1 to 4,000 Å.

6. The organic electroluminescent device according to claim 4, wherein the at least one layer selected from the hole-blocking layer, the electron injection layer, and the electron transport layer comprises an electron donor material.

7. The organic electroluminescent device according to claim 6, wherein the electron donor material is selected from the group consisting of:
   an aromatic compound having hydrogen, an alkyl group, or a phenyl group;
   an olefin compound having hydrogen, an alkyl group, or a phenyl group;
   an allene compound having hydrogen, an alkyl group, or a phenyl group;
   a thiophene compound having hydrogen, an alkyl group, or a phenyl group;
   a fulvalene heterocyclic compound having hydrogen, an alkyl group, or a phenyl group;
   poly(3,4-ethylene-dioxythiophene);
   tetraphenylethylene;
   azulene;
   1,2,3,4-tetraphenyl-1,3-cyclophentadiene; and
   bis(ethylenedithio)tetrathiafulvalene.

8. The organic electroluminescent device according to claim 6, wherein the electron donor material constitutes 0.01 to 50 wt. % of a total weight of the at least one layer selected from the hole-blocking layer, the electron injection layer, and the electron transport layer.

9. The organic electroluminescent device according to claim 6, wherein the at least one layer selected from the hole-blocking layer, the electron injection layer, and the electron transport layer are formed by spin-coating, front deposition, or co-deposition.

10. The organic electroluminescent device according to claim 6, wherein a thickness of the at least one layer selected from the hole-blocking layer, the electron injection layer, and the electron transport layer is 1 to 4,000 Å.

11. An organic electroluminescent device comprising:
   a substrate;
   a first electrode to define a pixel region formed on the substrate;
   multiple organic film layers to perform light emission formed on the first electrode; and
   a second electrode formed on the multiple organic film layers;
   wherein the multiple organic film layers comprise:
      an emitting layer;
      an electron transport layer; and
      at least one layer selected from a hole-blocking layer and an electron injection layer; and
   wherein the at least one layer selected from the hole-blocking layer and the electron injection layer comprises an electron donor material;
   wherein the hole-blocking layer directly contacts the emitting layer.

12. The organic electroluminescent device according to claim 11, wherein the electron donor material is selected from the group consisting of:
   an aromatic compound having hydrogen, an alkyl group, or a phenyl group;
   an olefin compound having hydrogen, an alkyl group, or a phenyl group;
   an allene compound having hydrogen, an alkyl group, or a phenyl group;
   a thiophene compound having hydrogen, an alkyl group, or a phenyl group;
   a fulvalene heterocyclic compound having hydrogen, an alkyl group, or a phenyl group;
   poly(3,4-ethylene-dioxythiophene);
   tetraphenylethylene;
   azulene;
   1,2,3,4-tetraphenyl-1,3-cyclophentadiene; and
   bis(ethylenedithio)tetrathiafulvalene.

13. The organic electroluminescent device according to claim 11, wherein the electron donor material constitutes 0.01 to 50 wt. % of a total weight of the at least one layer selected from the hole-blocking layer and the electron injection layer.

14. The organic electroluminescent device according to claim 11, wherein the multiple organic film layers further comprise at least one layer selected from a hole injection layer and a hole transport layer.

15. The organic electroluminescent device according to claim 11, wherein the at least one layer selected from the hole-blocking layer and the electron injection layer is formed by spin-coating, front deposition, or co-deposition.

16. The organic electroluminescent device according to claim 11, wherein a thickness of the at least one layer selected from the hole-blocking layer and the electron injection layer is 1 to 4,000 Å.

17. The organic electroluminescent device according to claim 11, wherein the electron transport layer comprises an electron donor material.

18. The organic electroluminescent device according to claim 14, wherein the at least one layer selected from the hole injection layer and the hole transport layer comprises an electron acceptor material.

19. The organic electroluminescent device according to claim 18, wherein the electron acceptor material is selected from the group consisting of:
   an aromatic compound having a nitro group or a cyano group;
   an olefin compound having a nitro group or a cyano group;
   a perylene compound having a nitro group or a cyano group;

a heterocyclic compound having a nitro group or a cyano group;
2,4,7-trinitrofluorenone;
2,4-dinitroaniline;
5-nitroanthranilonitrile
2,4-dinitrodiphenylamine
1,5-dinitronaphthalene; and
3,5-dinitrobenzonitrile.

20. An organic electroluminescent device comprising:
a substrate;
a first electrode to define a pixel region formed on the substrate;
multiple organic film layers to perform light emission formed on the first electrode; and
a second electrode formed on the multiple organic film layers;
wherein the multiple organic film layers comprise:
an emitting layer;
a hole-blocking layer;
an electron transporting layer; and
an electron injection layer comprising an electron donor material.

21. The organic electroluminescent device according to claim 11, wherein the electron transport layer does not comprise an electron donor material.

22. The organic electroluminescent device according to claim 11, wherein the electron transport layer is a single electron transport layer that is the only electron transport layer in the organic electroluminescent device.

23. The organic electroluminescent device according to claim 22, wherein one side of the single electron transport layer directly contacts the second electrode, and an opposite side of the single electron transport layer directly contacts the hole-blocking layer.

24. The organic electroluminescent device according to claim 11, wherein the hole-blocking layer is a single hole-blocking layer that is the only hole-blocking layer in the organic electroluminescent device.

* * * * *

UNITED STATES PATENT AND TRADEMARK OFFICE
CERTIFICATE OF CORRECTION

PATENT NO.         : 7,399,536 B2                                          Page 1 of 1
APPLICATION NO. : 10/757471
DATED              : July 15, 2008
INVENTOR(S)        : Min-Chul Suh

It is certified that error appears in the above-identified patent and that said Letters Patent is hereby corrected as shown below:

On Title Page, Item (57) Abstract, line 3, delete --;-- after "includes".

Column 8, line 38, change "comprise;" to --comprise:--.

Signed and Sealed this

Sixteenth Day of September, 2008

JON W. DUDAS
*Director of the United States Patent and Trademark Office*